(12) United States Patent
Takamura

(10) Patent No.: US 8,120,257 B2
(45) Date of Patent: Feb. 21, 2012

(54) ORGANIC ELECTROLUMINESCENCE LIGHTING DEVICE

(75) Inventor: Makoto Takamura, Kyoto (JP)

(73) Assignee: Rohm Co., Ltd., Kyoto-shi (JP)

( * ) Notice: Subject to any disclaimer, the term of this patent is extended or adjusted under 35 U.S.C. 154(b) by 438 days.

(21) Appl. No.: 12/476,748

(22) Filed: Jun. 2, 2009

(65) Prior Publication Data

US 2009/0302731 A1    Dec. 10, 2009

(30) Foreign Application Priority Data

Jun. 6, 2008  (JP) ................... 2008-149408
Jun. 6, 2008  (JP) ................... 2008-149415

(51) Int. Cl.
*H01J 7/44*    (2006.01)
*H01J 13/46*    (2006.01)
*H01J 17/34*    (2006.01)
*H01J 19/78*    (2006.01)
*H01J 23/16*    (2006.01)
*H01J 29/96*    (2006.01)
*H01K 1/62*    (2006.01)

(52) U.S. Cl. ...................... 315/32; 315/169.1; 315/169.3
(58) Field of Classification Search .................... 315/32, 315/158–159, 169.1, 169.3–169.4, 171
See application file for complete search history.

(56) References Cited

U.S. PATENT DOCUMENTS

| 6,776,496 B2 * | 8/2004 | Cok ............................... 362/84 |
| 2002/0125830 A1 * | 9/2002 | Okuda et al. ............... 315/169.3 |
| 2006/0113905 A1 * | 6/2006 | Nakamura .................... 313/511 |

FOREIGN PATENT DOCUMENTS

| JP | 2004-200041 | 7/2004 |
| JP | 2005-149744 | 6/2005 |

* cited by examiner

*Primary Examiner* — Anh Tran
(74) *Attorney, Agent, or Firm* — Hamre, Schumann, Mueller & Larson, P.C.

(57) ABSTRACT

An organic electroluminescence lighting device includes a planar organic electroluminescence element; a planer heat diffusion plate provided on one surface of the organic electroluminescence element; and a constant current circuit element that is placed so as to contact the heat diffusion plate and supplies a constant current to the organic electroluminescence element.

16 Claims, 12 Drawing Sheets

ORGANIC ELECTROLUMINESCENCE LIGHTING DEVICE

CROSS REFERENCE TO RELATED APPLICATIONS AND INCORPORATION BY REFERENCE

This application is based upon and claims the benefit of priority from prior Japanese Patent Application P2008-149408 filed on Jun. 6, 2008 and prior Japanese Patent Application P2008-149415 filed on Jun. 6, 2008; the entire contents of which are incorporated by reference herein.

TECHNICAL FIELD

The present invention relates to an organic electroluminescence (EL) lighting device including a constant current circuit element.

Moreover, the present invention relates to an organic EL lighting device including a rectifier circuit.

BACKGROUND ART

An organic EL element is an element that emits light in proportion to a current quantity. Therefore, in order that the organic EL element can maintain constant luminous intensity without depending on an external power supply, it is necessary to flow a constant current through the organic EL element. Moreover, the organic EL element is also a semiconductor device that exhibits diode characteristics, and has a possibility to be broken in such a manner that a value of the current rises owing to generated heat (Joule heat), and accordingly, it is necessary to flow the constant current therethrough. Accordingly, an organic EL device in which a constant current circuit is provided for the organic EL element has been proposed.

Patent Literature 1 discloses an organic EL display device including an organic EL element that has a driver circuit having a constant current circuit for flowing a constant current of several micron amperes. In this organic EL display device, a pair of driver circuits are arranged along two sides on a transparent substrate. The organic EL element and the driver circuit including the constant current circuit are integrated with each other as described above, whereby it has been possible to realize reliability enhancement, miniaturization, thinning and cost reduction of the organic EL display device.

Note that, in this organic EL display device, light emitting portions arranged in a matrix form are allowed to emit light by the driver circuits, whereby an image is displayed thereon.

Moreover, the organic EL lighting device includes the organic EL element having the diode characteristics. When the current flows through the organic EL element in a forward direction, the organic EL element emits light proportional to a value of the current. Hence, in the case of driving the organic EL lighting device by an alternating current power supply, blinking light emission occurs in accordance with a cycle of an alternating current. Here, a cycle of a usual commercial power supply (100V to 220V) of 50 Hz to 60 Hz is approximately 16.7 msec to 20.0 msc. This cycle is extremely long in comparison with a response speed of the organic EL device, which is from several nanoseconds to several ten nanoseconds. Therefore, even in the case of using an inverter or the like, blinking of the organic EL element cannot be suppressed, and hence, there has been a problem that the blinking concerned looks flickering to human eyes, resulting in uncomfortableness.

In this connection, Patent Literature 2 discloses an organic EL lighting device in which a rectifier circuit is connected between the alternating current power supply and the organic EL element. In this organic EL lighting device, the current is supplied to the organic EL element through the rectifier circuit, whereby it has been possible to suppress the blinking of the organic EL element.

CITATION LIST

Patent Literature

Patent Literature 1:
Japanese Patent Laid-Open Publication No. 2004-200041
Patent Literature 2:
Japanese Patent Laid-Open Publication No. 2005-149744

SUMMARY OF INVENTION

Technical Problem

However, in the organic EL display device of Patent Literature 1, the driver circuits are arranged along the two sides on the substrate, and accordingly, heat generated from the driver circuits is transmitted biasedly to the organic EL element. Hence, there has been a problem that a direct current resistance component varies in a plane of the organic EL element, resulting in that luminous intensity thereof is biased. In particular, in an organic EL lighting device that requires a large current (for example, several amperes), this problem becomes significant.

Moreover, in the organic EL lighting device of Patent Literature 2, the rectifier circuit and the organic EL element are provided separately from each other, and accordingly, there has been a problem that the organic EL lighting device is increased in size.

Solution to Problem

The present invention has been made in order to solve the above-described problems, and it is an object of the present invention to provide an organic EL lighting device capable of suppressing the bias of such in-surface luminous intensity.

Moreover, it is another object of the present invention to provide an organic EL lighting device capable of being miniaturized.

According to one aspect of the invention, an organic electroluminescence lighting device includes a planar organic electroluminescence element; a planer heat diffusion plate provided on one surface of the organic electroluminescence element; and a constant current circuit element that is placed so as to contact the heat diffusion plate and supplies a constant current to the organic electroluminescence element.

According to another aspect of the invention, an organic electroluminescence lighting device includes a planar organic electroluminescence element; and a rectifier circuit element that is placed integrally with the organic electroluminescence element, and performs full-wave rectification for an alternating current supplied from an outside to then supply the full-wave rectified current to the organic electroluminescence element.

ADVANTAGEOUS EFFECTS OF INVENTION

In accordance with the present invention, the heat can be allowed to conduct and can be diffused in the plane by bringing a heat diffusion plate and a constant current circuit in contact with each other. As a result, the bias of the luminous intensity can be suppressed.

Moreover, in accordance with the present invention, a rectifier circuit element is provided integrally with the organic EL element, whereby miniaturization of the organic EL lighting device can be realized.

DESCRIPTION OF EMBODIMENTS

First Embodiment

Figure 1:
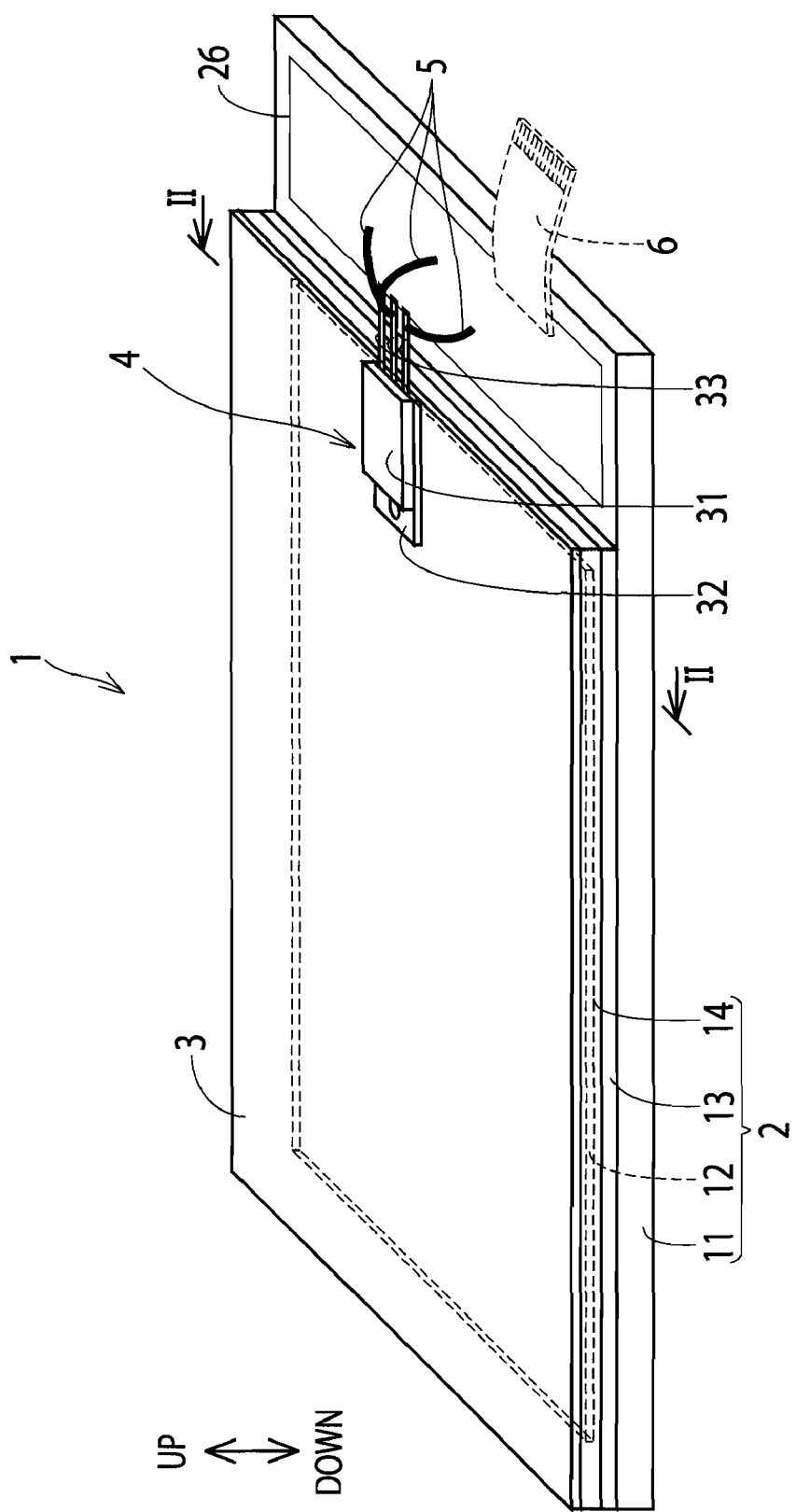
FIG. 1 is an overall perspective view of an organic EL lighting device according to a first embodiment.
Figure 2:
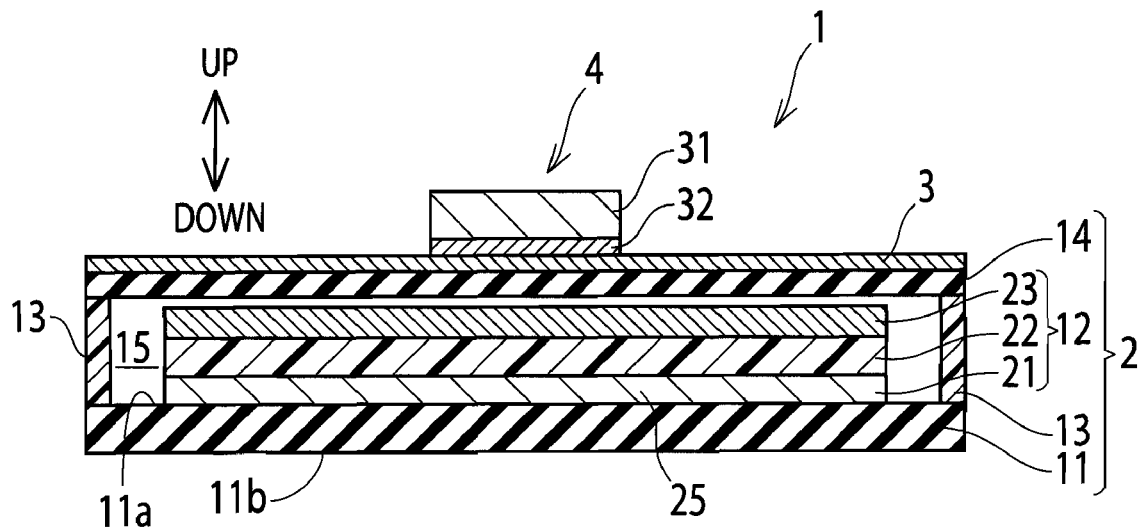
FIG. 2 is a cross-sectional view along a line II-II in FIG. 1.
Figure 3:
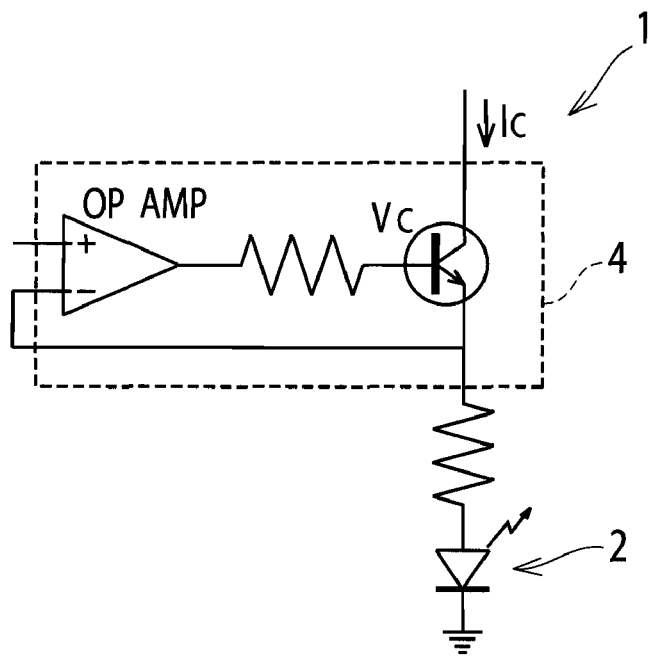
FIG. 3 is a circuit diagram of the organic EL lighting device.

A description will be made below of a first embodiment in which the present invention is applied to a bottom emission type organic EL lighting device with reference to the drawings. FIG. 1 is an overall perspective view of the organic EL lighting device according to the first embodiment. FIG. 2 is a cross-sectional view along a line II-II in FIG. 1. FIG. 3 is a circuit diagram of the organic EL lighting device. Note that up and down, which are shown in FIG. 1, are treated as orientations in the vertical direction in the following description.

The organic EL lighting device 1 includes: a planar organic EL element 2; a planer heat diffusion plate 3 provided on one surface of the organic EL element 2; and a constant current circuit element 4 that is placed so as to contact the heat diffusion plate 3 and supplies a constant current to the organic EL element 2.

As shown in FIG. 1 and FIG. 2, the organic EL lighting device 1 according to the first embodiment includes: the organic EL element 2; the heat diffusion plate 3; the constant current circuit element 4; and wires 5.

The organic EL element 2 is formed into a planar shape. The organic EL element 2 includes a substrate 11, an element portion 12, a sealing material 13, and a sealing plate 14. A region surrounded by the substrate 11, the sealing material 13 and the sealing plate 14 is a sealed region.

The substrate 11 is composed of a glass plate that has a thickness of approximately 0.5 mm and is capable of transmitting light therethrough. An upper surface of the substrate 11 is a main growth surface 11a on which the element portion 12 is formed. Moreover, a lower surface of the substrate 11 is a light taking-out surface 11b from which light is taken out.

The element portion 2 includes a transparent electrode 21, an organic light emitting layer 22, and a cathode (metal electrode) 23.

The transparent electrode 21 is made of indium tin oxide (ITO) that has a thickness of approximately 100 nm and is capable of transmitting the light therethrough. The transparent electrode 21 if formed on the main growth surface 11a of the substrate 11. The transparent electrode 21 includes an anode 25 and an external terminal 26.

The anode 25 is one for injecting holes into the organic light emitting layer 22. The anode 25 is formed on the main growth surface 11a in the sealed region 15. The anode 25 is formed integrally with a part of the external terminal 26.

The external terminal 26 is one for connecting the anode 25 and the cathode 23 to an external power supply (not shown) through a power supply terminal 6. The external terminal 26 is formed on the main growth surface 11a outside of the sealed region 15. The external terminal 26 is patterned, and is divided into a plurality of regions.

The organic light emitting layer 22 is one for emitting light. The organic light emitting layer 22 is formed on the anode 25 in a state of being electrically connected thereto. The organic light emitting layer 22 is formed in the sealed region 15. In the organic light emitting layer 22, a hole transporting layer and an electron transporting layer are stacked in order from the anode 25 side. The hole transporting layer is made of a diphenyl naphthyl diamine (NPD) film having a thickness of approximately 50 nm. The electron transporting layer is made of a quinolinol aluminum complex ($Alq_3$) film that has a thickness of approximately 50 nm and has coloring matter mixed thereinto. Moreover, copper phthalocyanine (CuPc) may be stacked between the anode 25 and the organic light emitting layer 22 in order to promote the hole injection from the anode 25.

The cathode electrode 23 is one for injecting electrons into the organic light emitting layer 22. The cathode 23 is formed on the organic light emitting layer 22 in a state of being electrically connected thereto. The cathode 23 is made of an Al film having a thickness of approximately 100 nm. The cathode 23 is electrically insulated from the anode 25 by an insulating film (not shown). One end portion of the cathode 23 is connected to the external terminal 26.

The sealing material 13 is one for sealing the substrate 11 and the sealing plate 14 to each other. The sealing material is made of insulating UV curing resin. The sealing material 13 is formed so as to surround an outside of the organic light emitting layer 22.

The sealing plate 14 is made of a glass substrate having a thickness of approximately 0.5 mm. The sealing plate 14 is formed into a rectangular shape smaller than the substrate 11.

The heat diffusion plate 3 is one for diffusing heat generated by the organic EL element 2 and the constant current circuit element 4, thereby suppressing high heat from occurring locally therein. The heat diffusion plate 3 may be composed of copper foil or Al foil subjected to anodization treatment. The heat diffusion plate 3 is adhered over an upper surface of the sealing plate 14, which is also one of surfaces of the organic EL element 2, while interposing a thermal conductive sheet (not shown) therebetween. Specifically, the heat diffusion plate 3 is provided on the cathode 23 side when viewed from the organic light emitting layer 22.

The constant current circuit element 4 is one for supplying the constant current to the organic EL element 2 without depending on the external power supply. As shown in FIG. 3, the constant current circuit element 4 is composed of a 3-terminal regulator having an amplifier, a transistor and the like. The constant current circuit element 4 is adhered to the vicinity of one side of the heat diffusion plate 3 on the external terminal 26 side. The constant current circuit element 4 includes a body portion 31, a heat radiation plate 32, and three terminals 33. The body portion 31 includes the above-described amplifiers, transistors and the like. The heat radiation plate 32 is placed on a lower surface of the body portion 31. The constant current circuit element 4 is placed so that the heat radiation plate 32 can be brought into surface contact with the heat diffusion plate 3. The respective terminals 33 protrude from the one side of the heat diffusion plate 3 to the above of the external terminal 26. The respective terminals 33 are connected to the external terminal 26 by the wires 5.

Next, a description will be made of operations of the organic EL lighting device 1 according to the above-described first embodiment.

First, the holes and the electrons are injected from the external power supply into the external terminal 26. The injected holes are injected into the organic light emitting layer 22 through the constant current circuit element 4 and the anode 25. Moreover, the injected electrons are injected into the organic light emitting layer 22 through the constant current circuit element 4 and the cathode 23. The holes and the electrons are recombined with each other in the organic light emitting layer 22, and emit light. The emitted light transmits through the anode 25 and the substrate 11, and is irradiated from the light taking-out surface 11b to the outside. Note that, since the organic EL lighting device 1 includes the constant current circuit element 4, the organic EL lighting device 1 holds the same light intensity without depending on a voltage applied thereto from the external power supply.

Here, since the organic EL lighting device 1 includes the heat diffusion plate 3, heat generated from the constant current circuit element 4 is diffused in the heat diffusion plate 3. Accordingly, high heat can be suppressed from occurring in the surface of the organic EL element 2. In such a way, a bias of a current value in the surface is suppressed, whereby a bias of the light is suppressed.

Next, a description will be made of a manufacturing process of the organic EL lighting device 1 according to the first embodiment. FIGS. 4 to 10 are cross-sectional views of the organic EL lighting device in each step of the manufacturing process.

Figure 4:
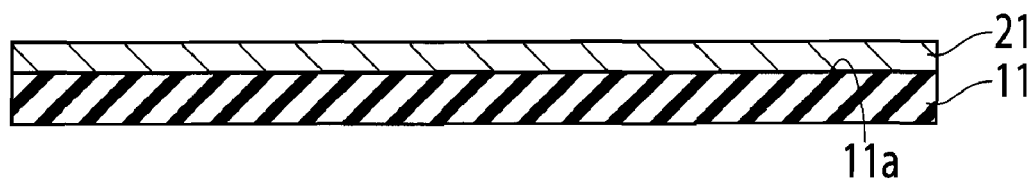
FIG. 4 is a cross-sectional view of the organic EL lighting device in a manufacturing process thereof.

First, as shown in FIG. 4, the transparent electrode 21 made of the ITO film is formed over the main growth surface 11a of the substrate 11.

Figure 5:
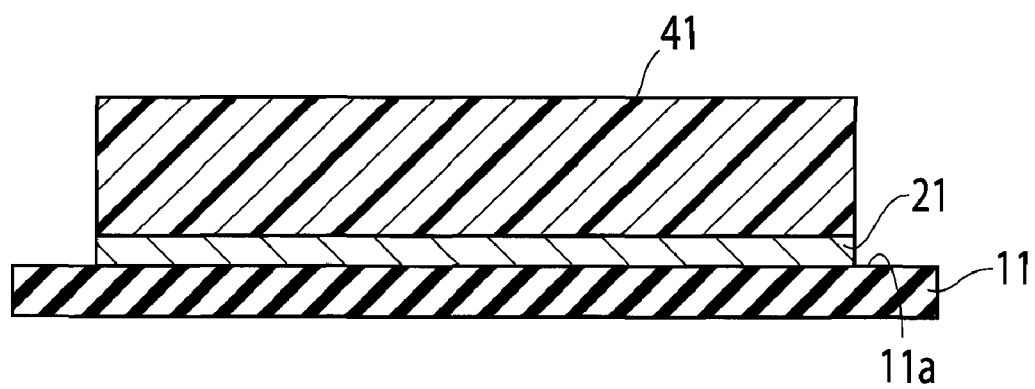
FIG. 5 is a cross-sectional view of the organic EL lighting device in the manufacturing process.

Next, as shown in FIG. 5, a resist film 41 is formed on a predetermined region of the transparent electrode 21 by using a photolithography technology. Thereafter, the transparent electrode 21 in a region exposed from the resist film 41 is etched. In such a way, the transparent electrode 21 including the anode 25 and the external terminal 26 is patterned.

Figure 6:
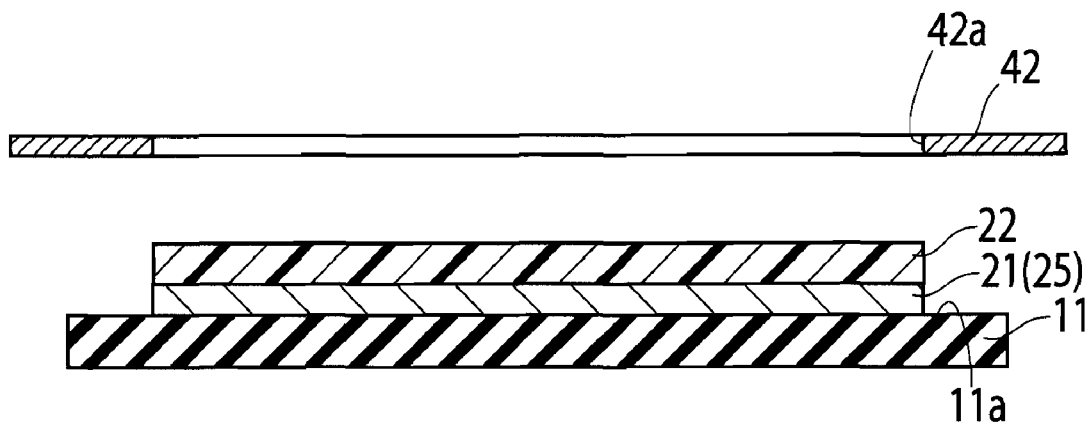
FIG. 6 is a cross-sectional view of the organic EL lighting device in the manufacturing process.

Next, as shown in FIG. 6, by using a shadow mask 42 in which an opening portion 42a is formed, the hole transporting layer and electron transporting layer of the organic light emitting layer 22 are sequentially evaporated on a desired region on the anode 25.

Figure 7:
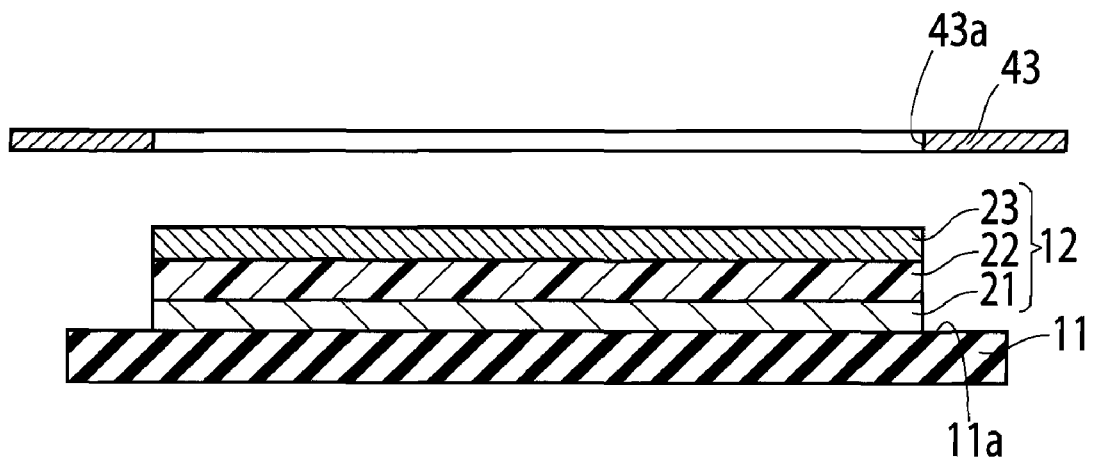
FIG. 7 is a cross-sectional view of the organic EL lighting device in the manufacturing process.

Next, as shown in FIG. 7, by using a shadow mask 43 in which an opening portion 43a is formed, the cathode 23 made of the Al film is evaporated on a desired region on the organic light emitting layer 22 and the transparent electrode 21.

Figure 8:
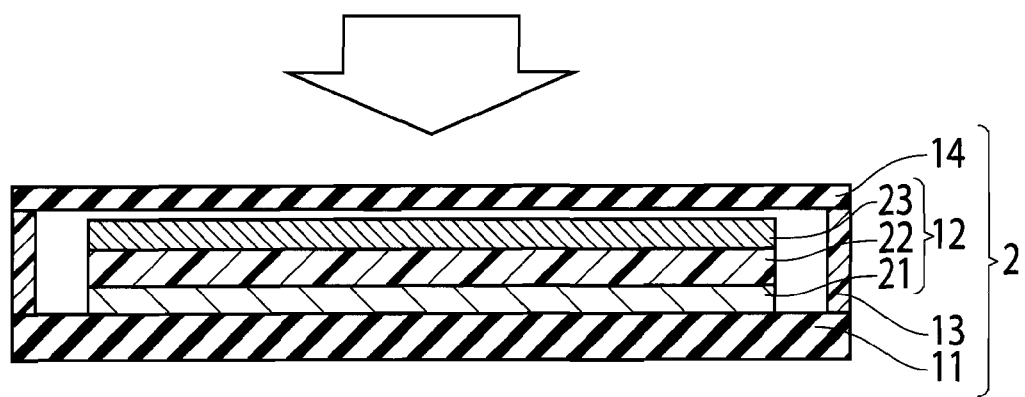
FIG. 8 is a cross-sectional view of the organic EL lighting device in the manufacturing process.

Next, as shown in FIG. 8, the sealing material 13 made of the UV curing resin is coated so as to surround an outer periphery of the organic light emitting layer 22. Thereafter, the sealing plate 14 is mounted on the sealing material 13. In this state, an ultraviolet (UV) ray is irradiated onto the sealing material 13, whereby the sealing material 13 is cured.

Figure 9:
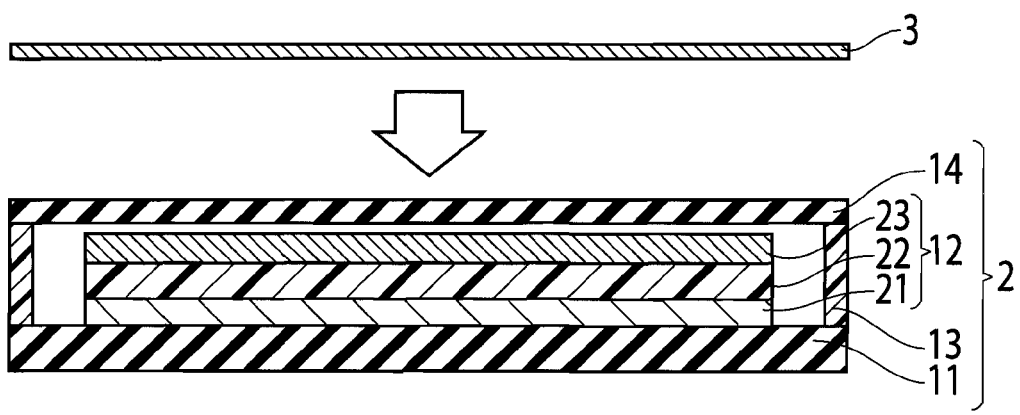
FIG. 9 is a cross-sectional view of the organic EL lighting device in the manufacturing process.

Next, as shown in FIG. 9, the heat diffusion plate 3 is pasted onto the organic EL element 2 while interposing the thermal conductive sheet therebetween so as to correspond to the upper surface of the sealing plate 14.

Figure 10:
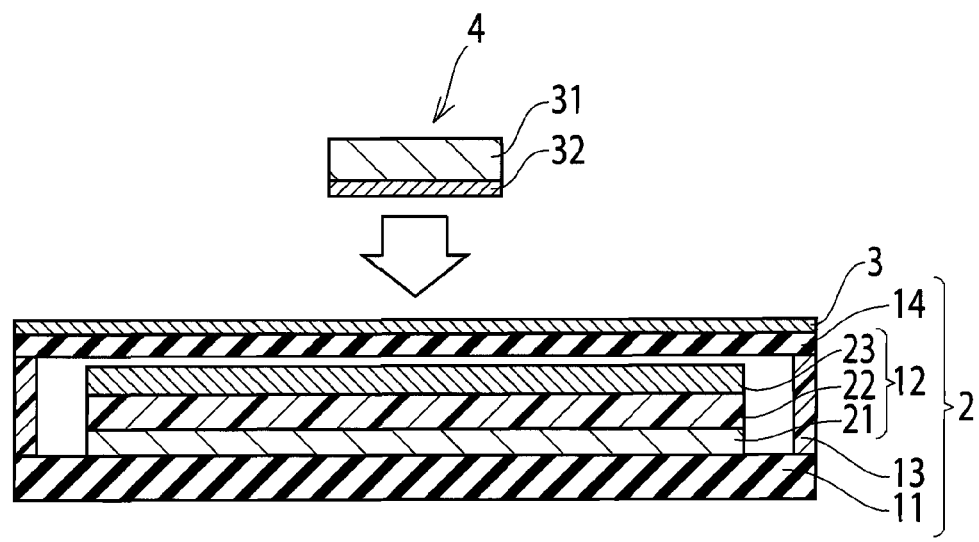
FIG. 10 is a cross-sectional view of the organic EL lighting device in the manufacturing process.

Next, as shown in FIG. 10, the constant current circuit element 4 is adhered onto a predetermined region of the heat diffusion plate 3. Thereafter, the terminals 33 of the constant current circuit element 4 are connected to the external terminal 26 by the wires 5.

In such a way, the organic EL lighting device 1 shown in FIG. 1 and FIG. 2 is completed.

As described above, in the organic EL lighting device 1 according to the first embodiment, the constant current circuit element 4 is adhered onto the heat diffusion plate 3 made of the Al plate having high thermal conductivity and heat radiation properties. In such a way, even if the constant current circuit element 4 generates the heat at the time of the light emission, the heat can be made to conduct and can be diffused by the heat diffusion plate 3 in the surface of the organic EL lighting device 1. Therefore, the high heat can be suppressed from occurring locally in the organic EL lighting device 1, and accordingly, a current value of the organic light emitting layer 22 can be suppressed from being biased in the surface. As a result, a bias of luminous intensity in the surface can be suppressed.

Moreover, in the organic EL lighting device 1, the heat diffusion plate 3 and the heat radiation plate 32 of the constant current circuit element 4 are adhered onto each other so as to be brought into surface contact with each other. In such a way, heat radiation properties of the constant current circuit element 4 can be further enhanced.

Furthermore, in the organic EL lighting device 1, the heat diffusion plate 3 is provided on the cathode 23 side, which is made of the Al film, when viewed from the organic light emitting layer 22. As described above, the heat diffusion plate 3 is provided on the cathode 23 side, which has the high thermal conductivity, whereby heat radiation properties of the heat diffusion plate 3 can be further enhanced.

Second Embodiment

Figure 11:
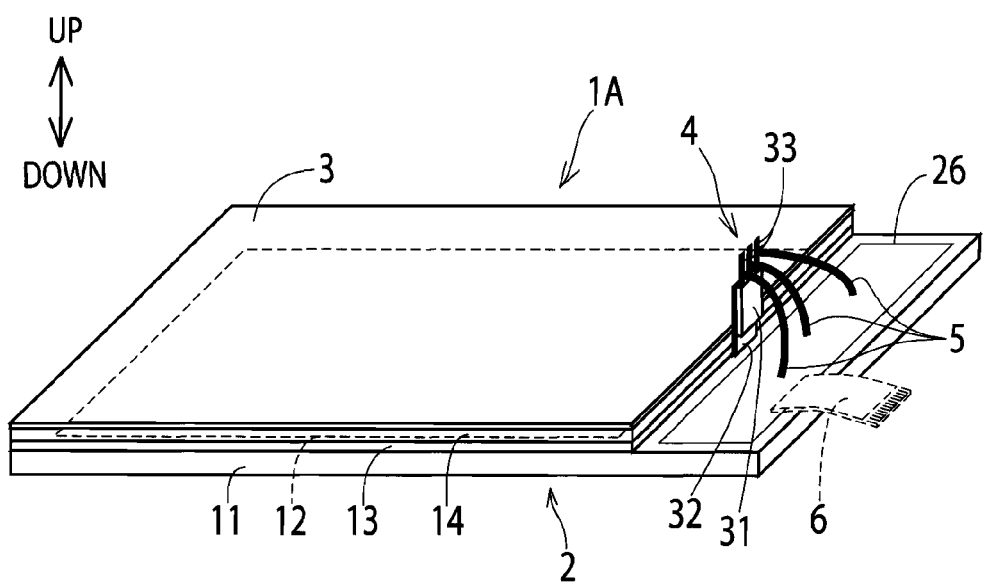
FIG. 11 is an overall perspective view of an organic EL lighting device according to a second embodiment.

Next, a description will be made of an organic EL lighting device according to a second embodiment in which the above-mentioned first embodiment is partially changed. FIG. 11 is an overall perspective view of the organic EL lighting device according to the second embodiment. Note that the same reference numerals are assigned to the same constituents as those in the first embodiment, and a description thereof will be omitted.

As shown in FIG. 11, in the organic EL lighting device 1A according to the second embodiment, the constant current circuit element 4 is erected with respect to the organic EL element 2. Here, the heat radiation plate 32 of the constant current circuit element 4 is placed so as to contact a side surface of the heat diffusion plate 3.

The constant current circuit element 4 is erected as described above, whereby the heat of the constant current circuit element 4 can be suppressed from being transmitted to the organic EL element 2. Moreover, slight heat transmitted to the organic EL element 2 is also diffused by the heat diffusion plate 3, and accordingly, the bias of the luminous intensity can be suppressed.

Third Embodiment

Figure 12:
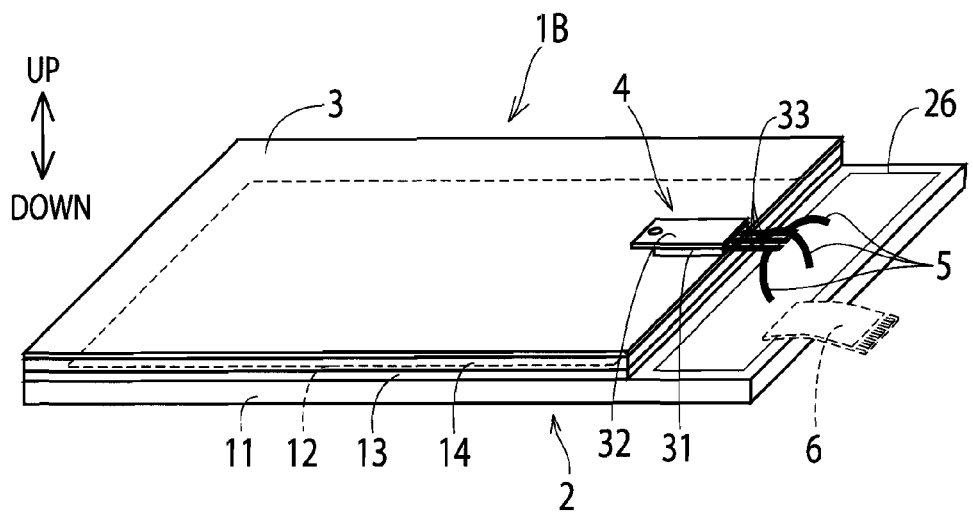
FIG. 12 is an overall perspective view of an organic EL lighting device according to a third embodiment.

Next, a description will be made of an organic EL lighting device according to a third embodiment in which the above-mentioned embodiments are partially changed. FIG. 12 is an overall perspective view of the organic EL lighting device according to the third embodiment. Note that the same reference numerals are assigned to the same constituents as those in the above-mentioned embodiments, and a description thereof will be omitted.

As shown in FIG. 12, in the organic EL lighting device 1B according to the third embodiment, the body portion 31 of the constant current circuit element 4 is adhered onto the heat diffusion plate 3. Specifically, the heat radiation plate 32 of the constant current circuit element 4 is placed so as to face outward. In such a way, the heat radiation properties of the constant current circuit element 4 can be further enhanced.

Fourth Embodiment

Figure 13:
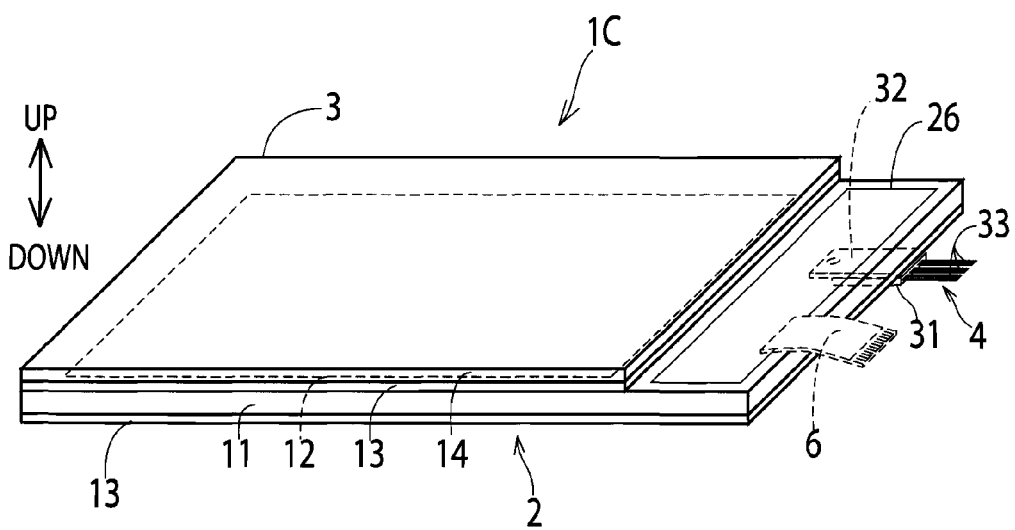
FIG. 13 is an overall perspective view of an organic EL lighting device according to a fourth embodiment.

Next, a description will be made of an organic EL lighting device according to a fourth embodiment in which the above-mentioned first embodiment is partially changed. FIG. 13 is an overall perspective view of the organic EL lighting device according to the fourth embodiment. Note that the same reference numerals are assigned to the same constituents as those in the first embodiment, and a description thereof will be omitted.

As shown in FIG. 13, in the organic EL lighting device 1C according to the fourth embodiment, the heat diffusion plate 3 is provided on the lower surface of the substrate 11. Moreover, the constant current circuit element 4 is adhered onto the heat diffusion plate 3 provided on the lower surface of the substrate 11. Such a configuration of the fourth embodiment is effective for a top emission type organic EL lighting device in which light is taken out from the sealing plate 14 side.

Fifth Embodiment

Figure 14:
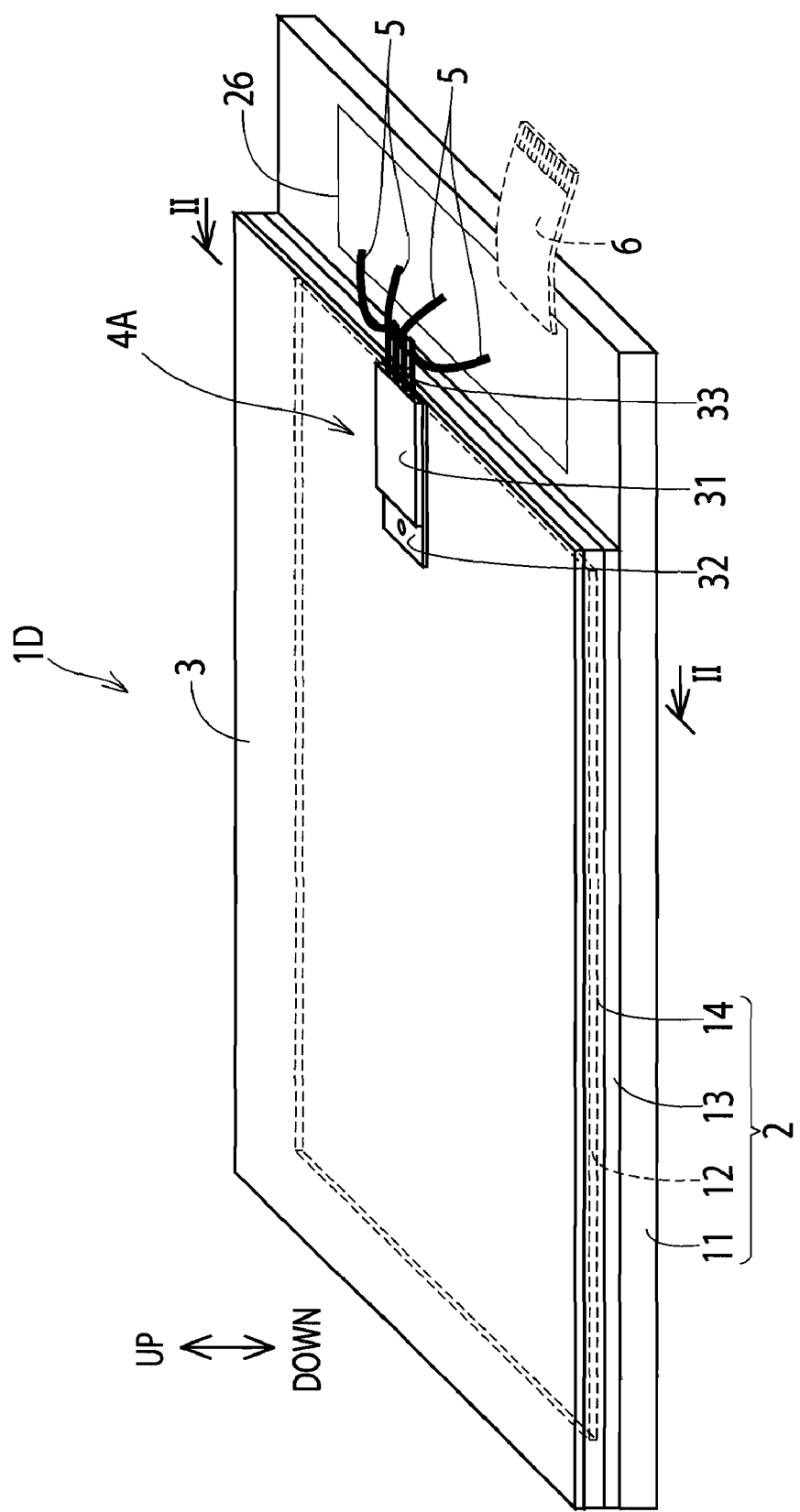
FIG. 14 is an overall perspective view of an organic EL lighting device according to a fifth embodiment.
Figure 15:
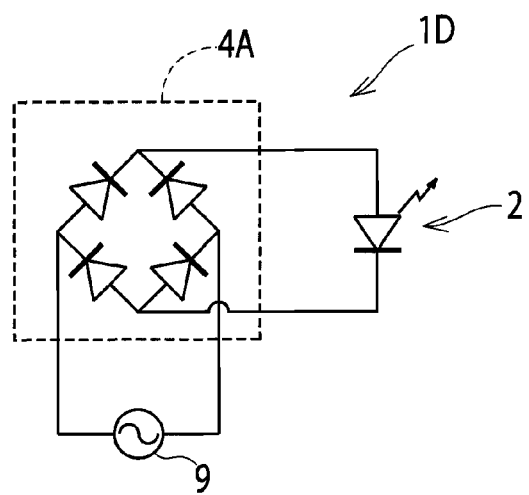
FIG. 15 is a circuit diagram of the organic EL lighting device.

A description will be made below of a fifth embodiment in which the present invention is applied to a bottom emission type organic EL lighting device with reference to the drawings. FIG. 14 is an overall perspective view of the organic EL lighting device according to the fifth embodiment. FIG. 15 is a circuit diagram of the organic EL lighting device. Note that up and down, which are shown in FIG. 14, are treated as orientations in the vertical direction in the following description. Note that the same reference numerals are assigned to the same constituents as those in the first embodiment, and a description thereof will be omitted.

The organic EL lighting device 1 includes: the planar organic EL element 2; and a rectifier circuit element 4A that is placed integrally with the organic EL element 2, and performs full-wave rectification for an alternating current supplied from the outside to then supply the full-wave rectified current to the organic EL element 2.

As shown in FIG. 14, the organic EL lighting device 1D according to the fifth embodiment includes: the organic EL element 2; the heat diffusion plate 3; the rectifier circuit element 4A; and the wires 5.

The rectifier circuit element 4A is one for performing the full-wave rectification for the alternating current supplied from an external power supply 9 to then supply the full-wave rectified current to the organic EL element 2. As shown in FIG. 15, the rectifier circuit element 4A is of a single-phase bridge rectification type having four diodes. The rectification circuit element 4A is adhered to the vicinity of one side of the heat diffusion plate 3 on the external terminal 26 side. The rectifier circuit element 4A includes the body portion 31, the heat radiation plate 32, and four terminals 33. The body portion 31 includes the above-described four diodes and the like. The heat radiation plate 32 is placed on the lower surface of the body portion 31. The rectifier circuit element 4A is placed so that the heat radiation plate 32 can be brought into surface contact with the heat diffusion plate 3. The respective terminals 33 protrude from the one side of the heat diffusion plate 3 to the above of the external terminal 26. The respective terminals 33 are connected to the external terminal 26 by the wires 5.

Figure 16:
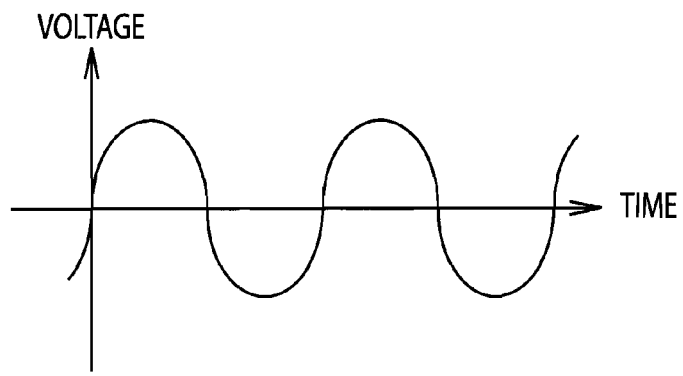
FIG. 16 is a graph showing a relationship between a voltage and time of an alternating current supplied from an external power supply.
Figure 17:
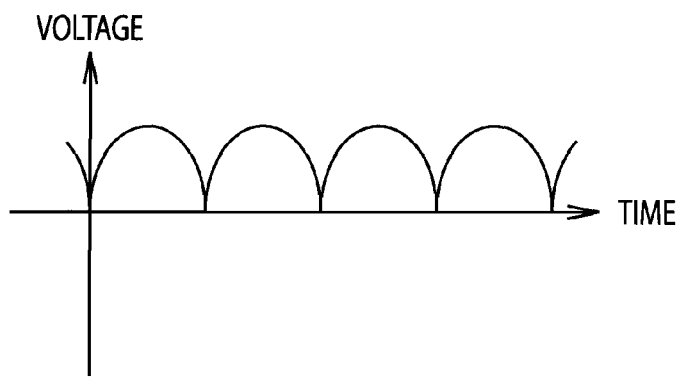
FIG. 17 is a graph showing a relationship between a voltage and time of a pulsating flow rectified by a rectifier circuit element.

Next, a description will be made of operations of the organic EL lighting device 1 according to the above-described fifth embodiment with reference to the drawings. FIG. 16 is a graph showing a relationship between a voltage and time of the alternating current supplied from the external power supply. FIG. 17 is a graph showing a relationship between a voltage and time of a pulsating flow rectified by the rectifier circuit element.

First, an alternating current shown in FIG. 16 is supplied from the alternating current external power supply 9 to the organic EL lighting device 1D. This alternating current is subjected to the full-wave rectification as shown in FIG. 17. Thereafter, the holes are injected into the organic light emitting layer 22 through the anode 25 by the full-wave rectified current. Moreover, the electrons are injected into the organic light emitting layer 22 through the cathode 23 by the full-wave rectified current. The injected holes and electrons are recombined with each other in the organic light emitting layer 22, and emit light. The light transmits through the anode 25 and the substrate 11, and is irradiated to the outside.

Here, in the organic EL lighting device 1D, the alternating current shown in FIG. 16 is subjected to the full-wave rectification as shown in FIG. 17 by the rectifier circuit element 4A. Accordingly, a blinking cycle of the organic EL lighting device 1D becomes a half of a cycle of the supplied alternating current. As a result, flickering of the organic EL lighting device 1D is reduced.

As described above, in the organic EL lighting device 1D according to the fifth embodiment, the rectifier circuit 4A is provided integrally with the organic EL element 2. In such a way, miniaturization of the organic EL lighting device 1D can be realized.

Moreover, in the organic EL lighting device 1D, the rectifier circuit element 4A is adhered onto the heat diffusion plate 3 made of the Al plate having high thermal conductivity and heat radiation properties. In such a way, even if the rectifier circuit element 4A generates the heat at the time of the light emission, the heat can be made to conduct and can be diffused by the heat diffusion plate 3 in the surface of the organic EL lighting device 1D. Therefore, the high heat can be suppressed from occurring locally in the organic EL lighting device 1D, and accordingly, the current value of the organic light emitting layer 22 can be suppressed from being biased in the surface. As a result, a bias of luminous intensity in the surface can be suppressed.

Moreover, in the organic EL lighting device 1D, the heat diffusion plate 3 and the heat radiation plate 32 of the rectifier circuit element 4A are adhered onto each other so as to be brought into surface contact with each other. In such a way, heat radiation properties of the rectifier circuit element 4A can be further enhanced.

Furthermore, in the organic EL lighting device 1D, the heat diffusion plate 3 is provided on the cathode 23 side, which is made of the Al film, when viewed from the organic light emitting layer 22. As described above, the heat diffusion plate 3 is provided on the cathode 23 side, which has the high thermal conductivity, whereby heat radiation properties of the heat diffusion plate 3 can be further enhanced.

Sixth Embodiment

Figure 18:
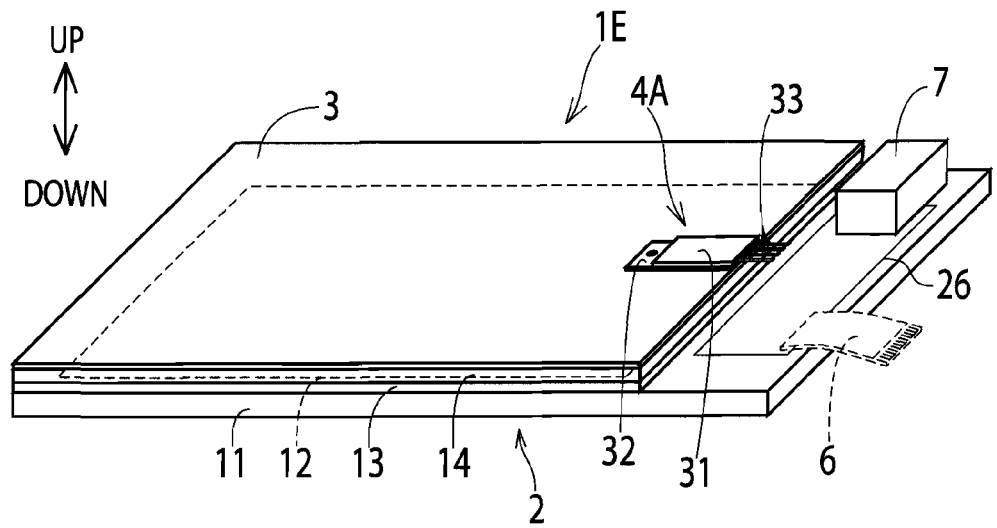
FIG. 18 is an overall perspective view of an organic EL lighting device according to a sixth embodiment.
Figure 19:
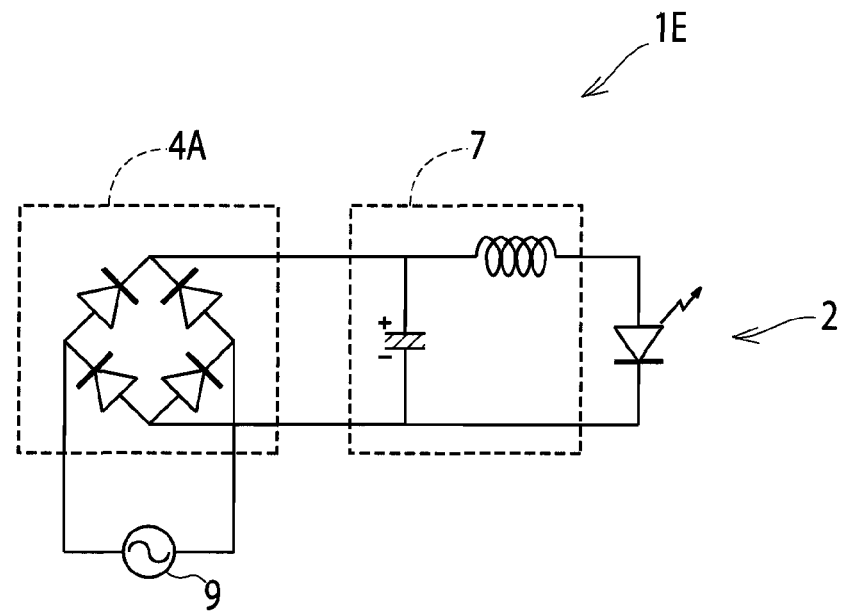
FIG. 19 is a circuit diagram of the organic EL lighting device.

Next, a description will be made of an organic EL lighting device according to a sixth embodiment in which the above-mentioned fifth embodiment is partially changed. FIG. 18 is an overall perspective view of the organic EL lighting device according to the sixth embodiment. FIG. 19 is a circuit diagram of the organic EL lighting device. Note that the same reference numerals are assigned to the same constituents as those in the fifth embodiment, and a description thereof will be omitted.

As shown in FIG. 18 and FIG. 19, the organic EL lighting device 1E includes a smoothing circuit element 7.

The smoothing circuit element 7 is one for smoothing the pulsating flow rectified by the rectifier circuit element 4A. The smoothing circuit element 7 is placed on the substrate 11 integrally therewith. As shown in FIG. 19, the smoothing circuit element 7 has an electrolytic capacitor and a choke coil.

The organic EL lighting device 1E according to the sixth embodiment includes the smoothing circuit element 7, and accordingly, can smooth the pulsating flow rectified by the rectifier circuit element 4A. In such a way, the current supplied to the organic EL element 2 becomes a direct current of an approximate threshold value or more. Accordingly, a time while the organic EL element 2 is being turned off is shortened, and therefore, the flickering caused by the blinking can be further suppressed.

Moreover, in the organic EL lighting device 1E, the smoothing circuit element 7 is provided on the substrate 11 of the organic EL element 2 integrally therewith. Accordingly, the above-described effects can be exerted while suppressing an increase in size of the organic EL lighting device 1E.

Seventh Embodiment

Figure 20:
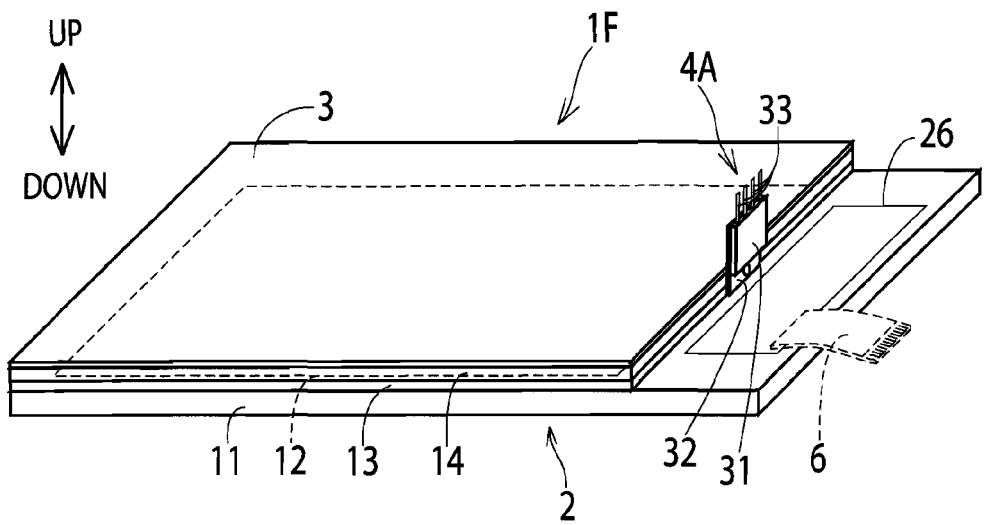
FIG. 20 is an overall perspective view of an organic EL lighting device according to a seventh embodiment.

Next, a description will be made of an organic EL lighting device according to a seventh embodiment in which the above-mentioned embodiments are partially changed. FIG. 20 is an overall perspective view of the organic EL lighting device according to the seventh embodiment. Note that the same reference numerals are assigned to the same constituents as those in the above-mentioned embodiments, and a description thereof will be omitted.

As shown in FIG. 20, in the organic EL lighting device 1F according to the seventh embodiment, the rectifier circuit element 4A is erected with respect to the organic EL element 2. Here, the heat radiation plate 32 of the rectifier circuit element 4A is placed so as to contact the side surface of the heat diffusion plate 3. Note that the wires which connect the terminals 33 of the rectifier circuit element 4A and the external terminal 26 to each other are not shown.

The rectifier circuit element 4A is erected as described above, whereby the heat of the rectifier circuit element 4A can be suppressed from being transmitted to the organic EL element 2. Moreover, slight heat transmitted to the organic EL element 2 is also diffused by the heat diffusion plate 3, and accordingly, the bias of the luminous intensity can be suppressed.

Eighth Embodiment

Figure 21:
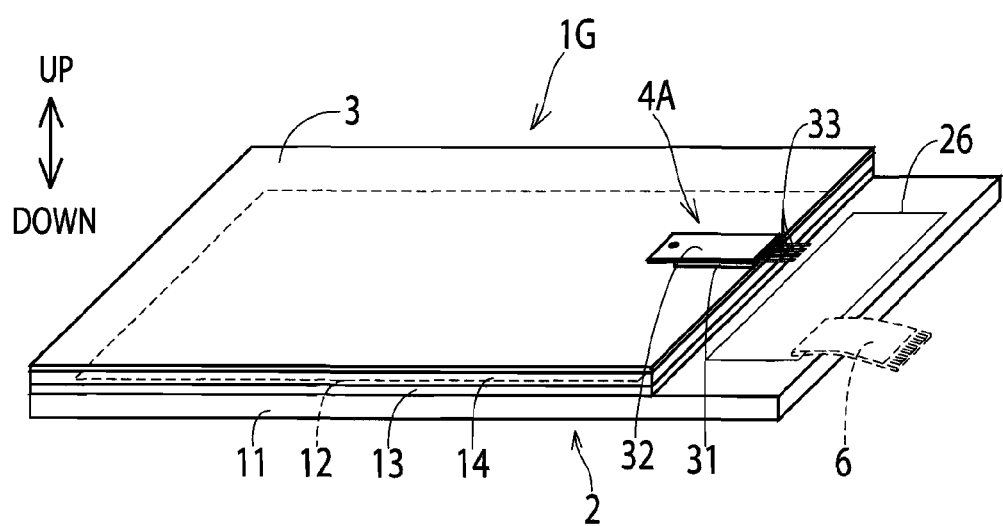
FIG. 21 is an overall perspective view of an organic EL lighting device according to an eighth embodiment.

Next, a description will be made of an organic EL lighting device according to an eighth embodiment in which the above-mentioned embodiments are partially changed. FIG. 21 is an overall perspective view of the organic EL lighting device according to the eighth embodiment. Note that the same reference numerals are assigned to the same constituents as those in the above-mentioned embodiments, and a description thereof will be omitted.

As shown in FIG. 21, in the organic EL lighting device 1G according to the eighth embodiment, the body portion 31 of the rectifier circuit element 4A is adhered onto the heat diffusion plate 3. Specifically, the heat radiation plate 32 of the rectifier circuit element 4A is placed so as to face outward. In such a way, the heat radiation properties of the rectifier circuit element 4A can be further enhanced. Note that the wires which connect the terminals 33 of the rectifier circuit element 4A and the external terminal 26 to each other are not shown.

Ninth Embodiment

Figure 22:
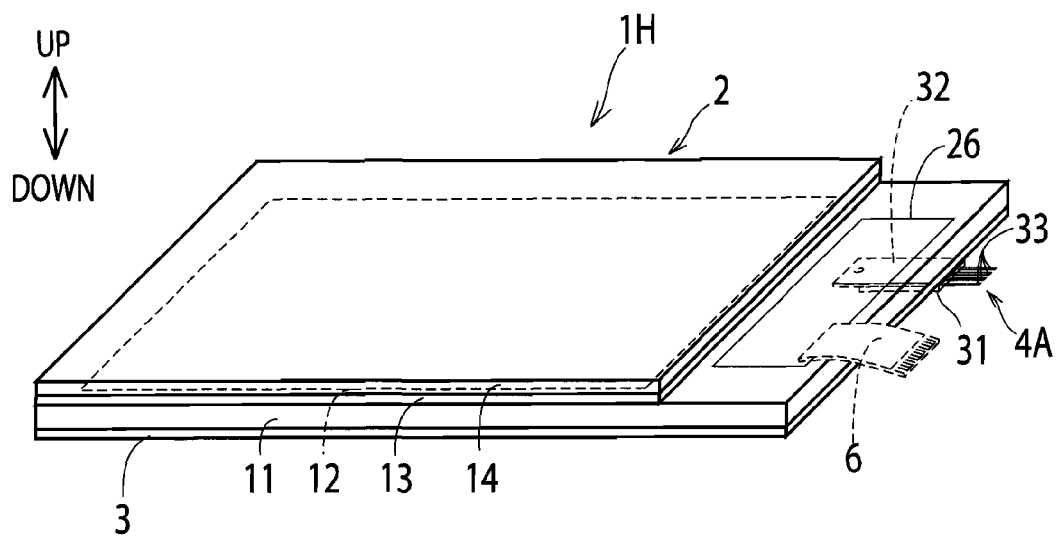
FIG. 22 is an overall perspective view of a organic EL lighting device according to a ninth embodiment.

Next, a description will be made of an organic EL lighting device according to a ninth embodiment in which the above-mentioned embodiments are partially changed. FIG. 22 is an overall perspective view of the organic EL lighting device according to the ninth embodiment. Note that the same reference numerals are assigned to the same constituents as those in the above-mentioned embodiments, and a description thereof will be omitted.

As shown in FIG. 22, in the organic EL lighting device 1H according to the ninth embodiment, the heat diffusion plate 3 is provided on the lower surface of the substrate 11. Moreover, the rectifier circuit element 4A is adhered onto the heat diffusion plate 3 provided on the lower surface of the substrate 11. Such a configuration of the ninth embodiment is effective for the top emission type organic EL lighting device in which the light is taken out from the sealing plate 14 side. Note that the wires which connect the terminals 33 of the rectifier circuit element 4A and the external terminal 26 to each other not shown.

Tenth Embodiment

Figure 23:
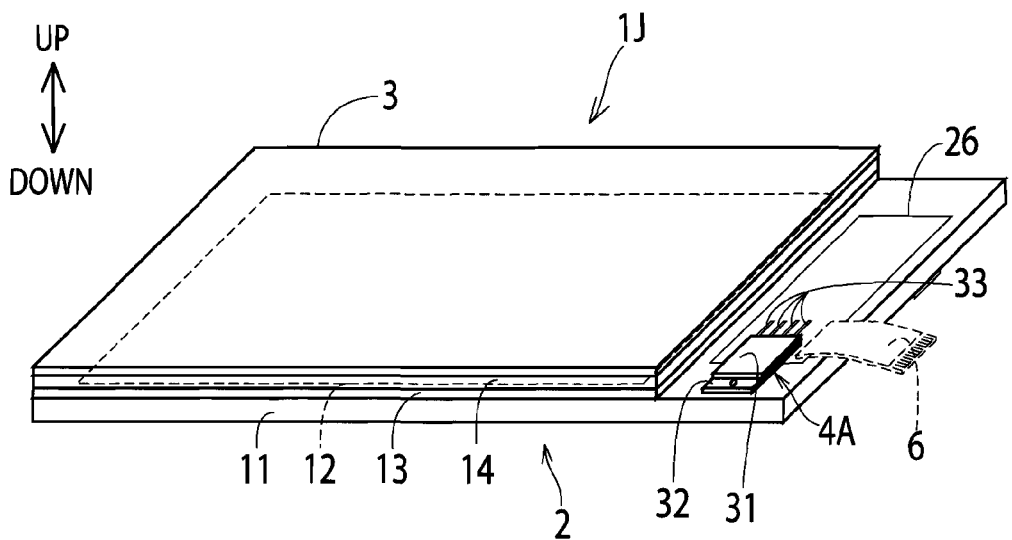
FIG. 23 is an overall perspective view of a organic EL lighting device according to a tenth embodiment.

Next, a description will be made of an organic EL lighting device according to a tenth embodiment in which the above-mentioned embodiments are partially changed. FIG. 23 is an overall perspective view of the organic EL lighting device according to the tenth embodiment. Note that the same reference numerals are assigned to the same constituents as those in the above-mentioned embodiments, and a description thereof will be omitted.

As shown in FIG. 23, in the organic EL lighting device 1J according to the tenth embodiment, the rectifier circuit element 4A is placed in region exposed to the outside, which belongs to the upper surface of the substrate 11 of the organic EL element 2. As described above, the rectifier circuit element 4A is placed on the organic EL element 2 integrally therewith, whereby miniaturization of the organic EL lighting device 1J can be realized. Note that the wires which connect the terminals 33 of the rectifier circuit element 4A and the external terminal 26 to each other are not shown.

The description has been made above of the present invention in detail by using the embodiments; however, the present invention is not limited to the embodiments described in this specification. The scope of the present invention is determined by the scope of claims and by an equilibrium scope of the scope of claims. A description will be made below of embodiments in which the above-mentioned embodiments are partially changed.

Shapes, numerical values and materials of the respective constituents in the above-mentioned embodiments are appropriately changeable.

For example, though a circuit configuration of the constant current circuit element is appropriately changeable, one with an element structure packed in a single chip is preferable. This is because the miniaturization, weight reduction and thinning of the organic EL lighting device can be thereby realized.

Moreover, though a circuit configuration of the rectifier circuit element is appropriately changeable, one with an element structure packed in a single chip is preferable. This is because the miniaturization, weight reduction and thinning of the organic EL lighting device can be thereby realized.

Moreover, in all of the embodiments, the smoothing circuit element may be added or omitted. Furthermore, the coil of the smoothing circuit element may be omitted.

REFERENCE SIGNS LIST 1, 1A, 1B, 1C, 1D, 1E, 1F, 1G, 1H, 1J organic EL lighting device
2 organic EL element
3 planer heat diffusion plate
4 constant current circuit element
4A rectifier circuit element
5 wire
6 power supply terminal
11 substrate
11a main growth surface
11b light taking-out surface
12 element portion
13 sealing material
14 sealing plate
15 sealed region
21 transparent electrode
22 organic light emitting layer
23 cathode
25 anode
26 external terminal
31 body portion
32 heat radiation plate
33 terminal

The invention claimed is:

1. An organic electroluminescence lighting device comprising:
a planar organic electroluminescence element;
a planer heat diffusion plate provided on one surface of the organic electroluminescence element; and
a constant current circuit element that is placed so as to contact the heat diffusion plate and supplies a constant current to the organic electroluminescence element.

2. The organic electroluminescence lighting device according to claim 1,
wherein the heat diffusion plate and the constant current circuit element are in surface contact with each other.

3. The organic electroluminescence lighting device according to claim 1,
wherein the constant current circuit element includes a heat radiation plate, and
the heat radiation plate and the heat diffusion plate are brought into surface contact with each other.

4. The organic electroluminescence lighting device according to claim 1,
wherein the constant current circuit element includes a heat radiation plate, and
the constant current circuit element is placed so that the heat radiation plate can face outward.

5. The organic electroluminescence lighting device according to claim 1,
wherein the constant current circuit element is erected with respect to the organic electroluminescence element.

6. The organic electroluminescence lighting device according to claim 1,
wherein the organic electroluminescence element includes an organic light emitting layer, and a metal electrode composed of a metal layer formed on one surface of the organic light emitting layer, and
the heat diffusion plate is provided on the metal electrode side when viewed from the organic light emitting layer.

7. The organic electroluminescence lighting device according to claim 1,
wherein the heat diffusion plate contains metal.

8. An organic electroluminescence lighting device comprising:
a planar organic electroluminescence element; and
a rectifier circuit element that is placed integrally with the organic electroluminescence element, and performs full-wave rectification for an alternating current supplied from an outside to then supply the full-wave rectified current to the organic electroluminescence element.

9. The organic electroluminescence lighting device according to claim 8, further comprising:
a planar heat diffusion plate provided on one surface of the organic electroluminescence element,
wherein the rectifier circuit element and the heat diffusion plate are in contact with each other.

10. The organic electroluminescence lighting device according to claim 8,
wherein the heat diffusion plate and the rectifier circuit element are in surface contact with each other.

11. The organic electroluminescence lighting device according to claim 8,
wherein the rectifier circuit element includes a heat radiation plate, and
the heat radiation plate and the heat diffusion plate are in surface contact with each other.

12. The organic electroluminescence lighting device according to claim 8,
wherein the rectifier circuit element includes a heat radiation plate, and
the rectifier circuit element is placed so that the heat radiation plate can face outward.

13. The organic electroluminescence lighting device according to claim 8,
wherein the rectifier circuit element is erected with respect to the organic electroluminescence element.

14. The organic electroluminescence lighting device according to claim 8, further comprising:
a smoothing circuit element placed integrally with the organic electroluminescence element.

15. The organic electroluminescence lighting device according to claim 9,
wherein the organic electroluminescence element includes an organic light emitting layer, and a metal electrode composed of a metal layer formed on one surface of the organic light emitting layer, and
the heat diffusion plate is provided on the metal electrode side when viewed form the organic light emitting layer.

16. The organic electroluminescence lighting device according to claim 9,
wherein the heat diffusion plate contains metal.

* * * * *